US011199647B2

(12) United States Patent
Malvesin et al.

(10) Patent No.: US 11,199,647 B2
(45) Date of Patent: Dec. 14, 2021

(54) EFFECTIVE PERMEABILITY UPSCALING FOR A DISCRETE FRACTURE NETWORK

(71) Applicant: Schlumberger Technology Corporation, Sugar Land, TX (US)

(72) Inventors: Emmanuel Malvesin, Montpellier (FR); Jean Pierre Joonnekindt, Montpellier (FR)

(73) Assignee: Schlumberger Technology Corporation, Sugar Land, TX (US)

( * ) Notice: Subject to any disclaimer, the term of this patent is extended or adjusted under 35 U.S.C. 154(b) by 591 days.

(21) Appl. No.: 16/065,812

(22) PCT Filed: Dec. 29, 2016

(86) PCT No.: PCT/US2016/069067

§ 371 (c)(1),
(2) Date: Jun. 24, 2018

(87) PCT Pub. No.: WO2017/120088

PCT Pub. Date: Jul. 13, 2017

(65) Prior Publication Data

US 2019/0011600 A1 Jan. 10, 2019

(30) Foreign Application Priority Data

Jan. 4, 2016 (FR) ...................................... 1650015

(51) Int. Cl.
*G01V 99/00* (2009.01)
*E21B 49/00* (2006.01)
(Continued)

(52) U.S. Cl.
CPC ........ *G01V 99/005* (2013.01); *E21B 41/0092* (2013.01); *E21B 49/00* (2013.01);
(Continued)

(58) Field of Classification Search
CPC ................ G01V 99/00; G01V 99/005; G01V 2210/642; G01V 2210/646; E21B 49/00; E21B 49/0092; G06F 17/12
See application file for complete search history.

(56) References Cited

U.S. PATENT DOCUMENTS

2013/0096889 A1 4/2013 Khvoenkova et al.
2014/0372089 A1* 12/2014 Weng ...................... E21B 43/26 703/2

(Continued)

OTHER PUBLICATIONS

International Preliminary Report on Patentability for the equivalent International patent application PCT/US2016/069067 dated Jul. 19, 2018.

(Continued)

*Primary Examiner* — John E Breene
*Assistant Examiner* — Liam R Casey

(57) ABSTRACT

A method for computing effective permeability for a discrete fracture network in a subterranean environment. The method may include: obtaining (800) attributes of the discrete fracture network, spatially sampling (810) points on the surfaces of fractures inside a computation cell; allocating (820) to each sampled point at least one attribute of the corresponding fracture, computing (850) discrete pressure values in the computation cell at the location of the sampled points by solving partial derivative equations of a flow model; computing effective permeability (860) values for the computation cell from the pressures values.

11 Claims, 8 Drawing Sheets

(51) Int. Cl.
*G06F 17/12* (2006.01)
*G06F 30/20* (2020.01)
*E21B 41/00* (2006.01)

(52) U.S. Cl.
CPC ........ *G06F 30/20* (2020.01); *G01V 2210/642* (2013.01); *G01V 2210/646* (2013.01); *G06F 17/12* (2013.01)

(56) References Cited

U.S. PATENT DOCUMENTS

| | | | | |
|---|---|---|---|---|
| 2015/0355374 | A1* | 12/2015 | Morton | G01V 99/005 703/10 |
| 2015/0377005 | A1* | 12/2015 | Garcia-Teijeiro | E21B 47/0224 703/10 |
| 2016/0115768 | A1* | 4/2016 | Lee | E21B 43/00 702/6 |
| 2016/0341850 | A1* | 11/2016 | Lin | E21B 43/26 |
| 2017/0212276 | A1* | 7/2017 | Jerbi | G01V 99/005 |
| 2018/0306015 | A1* | 10/2018 | Shetty | G01V 99/005 |

OTHER PUBLICATIONS

Alghalandis, et al., "A general framework for fracture intersection analysis: algorithms and practical applications," Austrian Geothermal Energy Conference 2011, pp. 15-20, 2011.

Atluri, et al., "The meshless local Petrov-Galerkin (MLPG) approach for solving problems in elasto-statics," Computational Mechanics, vol. 25 (2-3), pp. 169-179, 2000.

Bao, et al., "Upscaling of Permeability Field of Fractured Rock System: Numerical Examples," Journal of Applied Mathematics, vol. 2012, Article ID 546203, pp. 1-20, 2012.

Elfeel, et al., "Static and dynamic assessment of DFN Permeability Upscaling," SPE154369, SPE Europe/EAGE Annual Conference Jun. 4-7, 2012, Copenhagen, Denmark.

Fumagalli, et al., "An upscaling procedure for fractured reservoirs with non-matching grids," MOX—Report No. 33/2015, Politecnico di Milano, pp. 1-36, Sep. 28, 2015.

Jourdain, et al., "Upscaling permeability for fractured concrete: meso-macro numerical approach coupled to strong discontinuities," International Journal for Numerical and Analytical Methods in Geomechanics, vol. 38, No. 5, pp. 536-550, Apr. 10, 2014.

Koudina, et al., "Permeability of three dimensional fracture networks," Physical Review E, Apr. 1, 1998, vol. 57, No. 4, pp. 4466-4479.

Xue-Hong, et al., "Meshless method based on the local weak forms for steady state heat conduction problems," International Journal of Heat and Mass Transfer, vol. 51, 2008, pp. 3103-3112.

International Search Report and Written Opinion for the equivalent International patent application PCT/US2016/069067 dated Apr. 14, 2017.

Bishop, et al., "A Finite-Element Method for Modeling Fluid-Pressure Induced Discrete-Fracture Propagation Using Random Meshes," 46th US Rock Meehanics/Geomechanics Symposium, Jun. 1, 2012.

Dershowitz, et al., "Advances in Discrete Fracture Network Modeling," Jan. 1, 4004, retrieved on Sep. 13, 2016 at https ://www.researchgate.net/profile/Paul_La_Pointe/publication/22904722_Advances_in_discrete_fracture_network_modeling/links/00b7d533afbc772faf000000.pdf?origin=publication_detail.

Liu, et al., "Calculation of the Effective Permeaility Tensor Used in the Naturally Fractured Reservoirs Simulation," Proceedings of the 2015 International Conference on Electrical, Automation ad Mechanical Engineering, Jan. 1, 2015, Paris, France.

Zhuang, et al., "Fracture modeling using meshless methods and level sets in 3D: Framework and modeling," International Journal of Numerical Methods in Engineering, vol. 92, No. 11, Dec. 14, 2012, pp. 969-998, GB.

Extended Search Report for the equivalent European patent application 16884217.7 dated Aug. 8, 2019.

Dershowitz et al. "Advances in Discrete Fracture Network Modeling," Jan. 1, 2004 (Jan. 1, 2004), Retrieved from the Internet URL https://www.researchgate.net/profile/Paul_La_Pointe/publication/22904722_Advances_in_discrete_fracture_network_modeling/links/00b7d533afbc772faf000000.pdf?origin=publication_detail.

Communication pursuant to Article 94(3) EPC dated May 12, 2020 (May 12, 2020) in corresponding European Patent Application No. 16884217.7 (8 pages).

Belytschko, "Element-free Galerkin methods," Numerical Methods in Engineering, Jan. 30, 1994, vol. 37, pp. 229-256.

* cited by examiner

EFFECTIVE PERMEABILITY UPSCALING FOR A DISCRETE FRACTURE NETWORK

BACKGROUND

Natural fractures in a subterranean formation may provide information for fluid storage, fluid flow, etc. As an example, a fluid reservoir may exist in a subterranean formation that includes natural fractures. For example, the naturally fractured reservoirs represent more than half of the remaining petroleum reserves. Modeling of the pressure and/or effective permeability due to a fracture network can thus provide valuable information for reservoir simulation, for example, for well operators, drilling service providers, etc.

Any numerical reservoir simulation may rely on an accurate estimate of the effective permeability (also referred to as the equivalent permeability). The accuracy is used for a successful production of oil recovery from the reservoir. In standard workflows, the computation starts from a discrete fracture network (DFN) model from which the effective permeability may then be computed.

Different methods may be used for the computation of the effective permeability. As an example, the document entitled "Static and Dynamic Assessment of DFN permeability upscaling" by Elfeel. A. et al, Society of Petroleum Engineers, 2012, describes several methods, in particular the Oda's method and the flow-based method. The Oda's method relies on the geometry of the discrete fracture planes and on a statistical analysis based on the number and sizes of the fractures in each simulation cell of a simulation grid. The flow-based method relies on finite element simulations of the flow model separately in each of the three spatial directions so as to simulate a single-phase fluid flow due to a pressure gradient across the fracture network within a given simulation cell of a simulation grid.

While Oda's method is fast, Oda's method generally overestimates the equivalent permeability and may be inaccurate for poorly connected fracture networks. The flow-based method is much more accurate but remains computationally very expensive. For example, in the flow-based method, a triangle mesh is used for representing the fractures of the DFN as well as the fractures intersections. Not only all the fractures must be meshed, but all the fracture intersections must exactly match with triangle edges of the triangle mesh. As an example, FIG. 3A represents two rectangular fractures 310, 311 and their intersection 320 together with a triangular mesh fitting those two fractures 310, 311 and matching exactly their intersection 320. The triangulation process must indeed comply with the finite elements (or finite volume) requirements and the same constraints thus apply at the simulation cell level meaning that fracture network mesh must be re-cut for each simulation cell of the simulation grid. It turns out that the triangulation process (also called meshing process) is not only the most complex task, it is also the greediest step in term of computational time.

Furthermore, the optimum size for the simulation cell for the Oda method or the flow-based method is also very difficult to determine and would require, ideally an iterative process to be efficiently computed.

SUMMARY

Embodiments of the disclosure may provide systems, methods, and computer program product for computing effective permeability for a discrete fracture network. The method may comprise obtaining attributes of the discrete fracture network; spatially sampling points on the surface of fractures inside a volume of a computation cell; allocating to each sampled point at least one attribute of the corresponding fracture; computing discrete pressure values for the locations corresponding to the sampled points by solving partial derivative equations of a flow model using the allocated attributes; computing effective permeability values induced by the fractures present in the volume of the computation cell from the discrete pressure values.

According to yet other aspects, disclosed is a computer program product comprising computer-executable instructions that when executed by a processor causes said processor to perform a method for computing effective permeability according to any embodiment disclosed herein.

According to yet other aspects, disclosed is a computing system comprising one or more processors for processing data; memory operatively coupled to the one or more processors that comprises program instructions for causing said one or more processors to perform a method for computing effective permeability according to any embodiment disclosed herein.

This summary is provided to introduce a selection of concepts that are further described below in the detailed description. This summary is not intended to identify key or essential features of the claimed subject matter, nor is it intended to be used as an aid in limiting the scope of the claimed subject matter.

BRIEF DESCRIPTION OF THE DRAWINGS

Features and advantages of the described implementations can be more readily understood by reference to the following description taken in conjunction with the accompanying drawings.

DETAILED DESCRIPTION

The following description includes the best mode presently contemplated for practicing the described implementations. This description is not to be taken in a limiting sense, but rather is made merely for the purpose of describing the general principles of the implementations.

In a discrete fracture network (DFN) model large and/or big fractures are modeled explicitly as discrete patches, while an Implicit Fracture Model (IFM) is used for representing statistically the residual part of the fracture distribution (i.e. the smaller fractures) by grid properties. A DFN model comprises fracture attributes representative of various structural properties of the fractures. A DFN model may for example represent the distribution of fractures (e.g. fracture intensity, type of distribution), the geometry of fractures (e.g. shape, width, length and thickness) and/or the orientation of fractures (e.g. mean dip, mean azimuth). As an example, natural fractures may be characterized at least in part by orientation or dip, size and thickness. As an example, a natural fracture may be characterized in part by a length/width aspect ratio.

Figure 1:
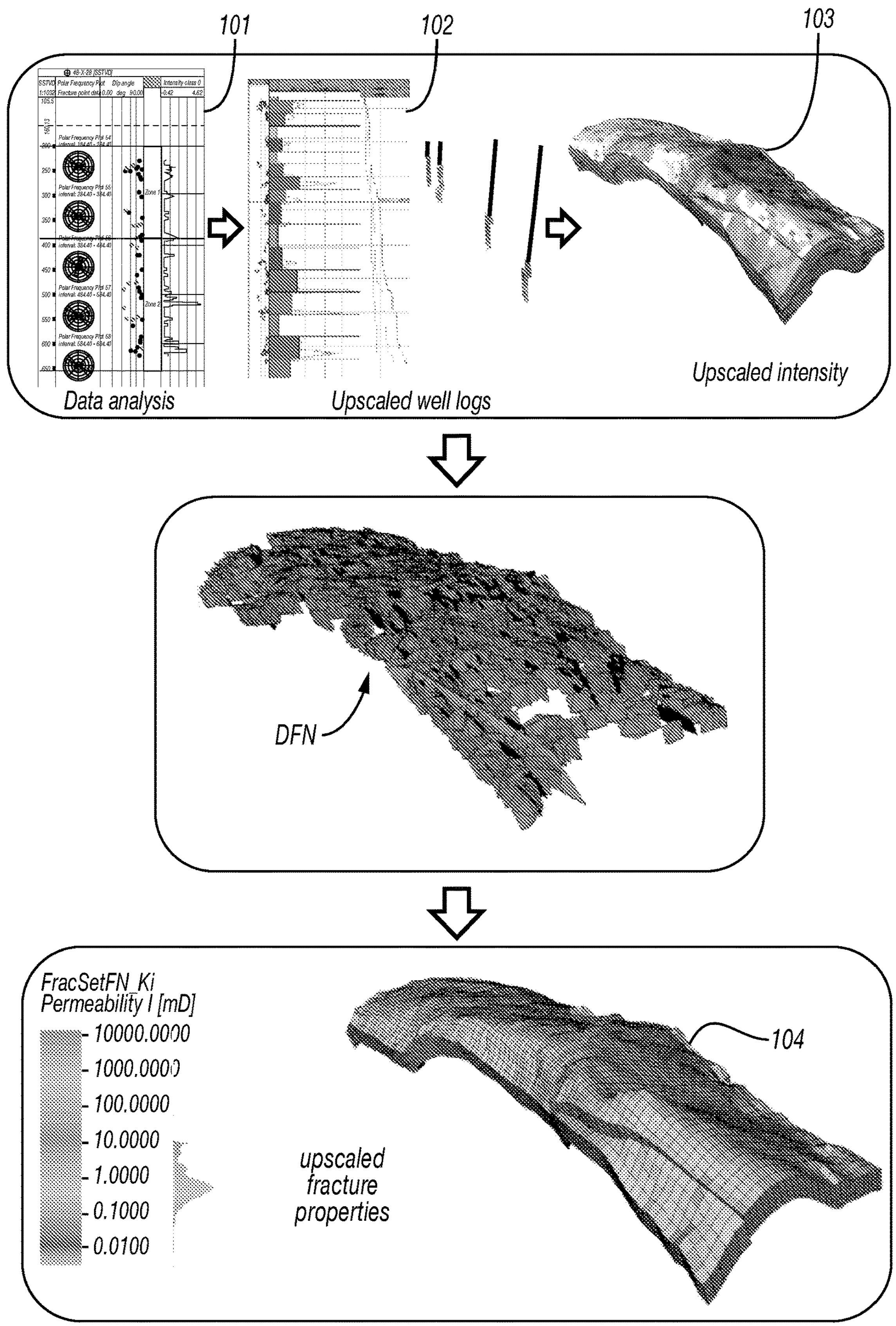
FIG. 1 illustrate a general workflow for computing the effective permeability in a geologic environment.

As illustrated schematically by FIG. 1, a DFN model may be computed from data acquired in the subterranean formation by data acquisition tools. The data acquisition tools may include physical tools that are configured to obtain measurements of a subterranean formation and to detect some characteristics of the geological structures of the subterranean formation. For example, data plots 101 may be obtained by the data acquisition tools. The data plots may be analyzed to generate upscaled well logs 102 which in turn may be used to generate a three-dimensional representation 103 of the upscaled parameters (e.g. fracture intensity and/or of other fracture attributes). For example the density, distribution and orientation of the fractures will be analyzed based on the well logs 102. The density $P_{32}$ (fracture area/unit volume) may be calculated and upscaled along wells. Then, using different statistical functions may be applied to determine the attributes density, fracture strike and dip, calibrated against the different density observed in wells.

The discrete fracture network (DFN) model may be generated on the basis of previously computed attributes 103 (density $P_{32}$, fracture orientation, etc). Different geometries regarding the distribution of fracture length may be tested and calibrated against the fracture distribution. For example, several fracture attributes may be computed to generate the DFN model: shape, width, length, thickness, orientation, mean dip, mean azimuth, etc.

Finally, upscaled fracture properties 104 may be determined for the DFN, for example pressure values and effective permeability values.

A natural fracture may be a crack or surface of breakage within rock not related to foliation or cleavage in metamorphic rock along which there has been no movement. A fracture along which there has been displacement is a fault. When walls of a fracture have moved only normal to each other, the fracture is called a joint. Fractures can enhance permeability of rocks greatly by connecting pores together, and for that reason, fractures are induced mechanically in some reservoirs in order to boost hydrocarbon flow. Fractures may also be referred to as natural fractures to distinguish them from fractures induced as part of a reservoir stimulation or drilling operation. In some shale reservoirs, natural fractures improve production by enhancing effective permeability.

Natural fractures may exist in clusters, for example, spaced several hundred feet apart along a general direction. Such natural fractures may enhance permeability locally and may be beneficial to techniques to enhance recovery.

As an example, a naturally fractured reservoir can include a rock matrix along with a set of natural fractures. Where multiple natural fractures have been propagated in a formation, the multiple natural fractures may form natural fracture networks, which, for example, can contribute to storage (e.g., via porosity) and fluid flow (e.g., via permeability, transmissibility, etc.). As to fluid production from such a reservoir, natural fractures may provide for comparatively fast fluid flow and may be present at various scales.

As an example, modeling of the natural fracture properties may enhance decision-making based on determinations as to whether the natural fracture is beneficial or detrimental to a particular goal or goals. For example, if a natural fracture stores a certain amount of a desired fluid (e.g., a substantial amount), modeling may enhance decision-making as to where a producer well and an injector well may be positioned to recover at least a portion of the desired fluid from the natural fracture (e.g., consider modeling flow due to applied pressure, breakthrough, recovery of desired fluid, etc.).

For the practical purposes of dynamic reservoir modeling, a simulation grid is defined and the fracture properties of the DFN are upscaled for each simulation cell of the simulation grid. For example pressure values and/or effective permeability values may be computed for each simulation cell. A numerical reservoir simulation may then be performed on the basis of the computed effective permeability values.

Instead of the triangle mesh of the flow-based method used for the simulation of the fluid flow model, the computation method described herein relies on a discrete representation of the fractures inside the volume of a simulation cell. This discrete representation may be generated by spatially sampling points $P_i$ on the surface of the fractures and by allocating to those sampled points $P_i$ the attributes of the fracture from which those points $P_i$ have been sampled.

Figure 3A:
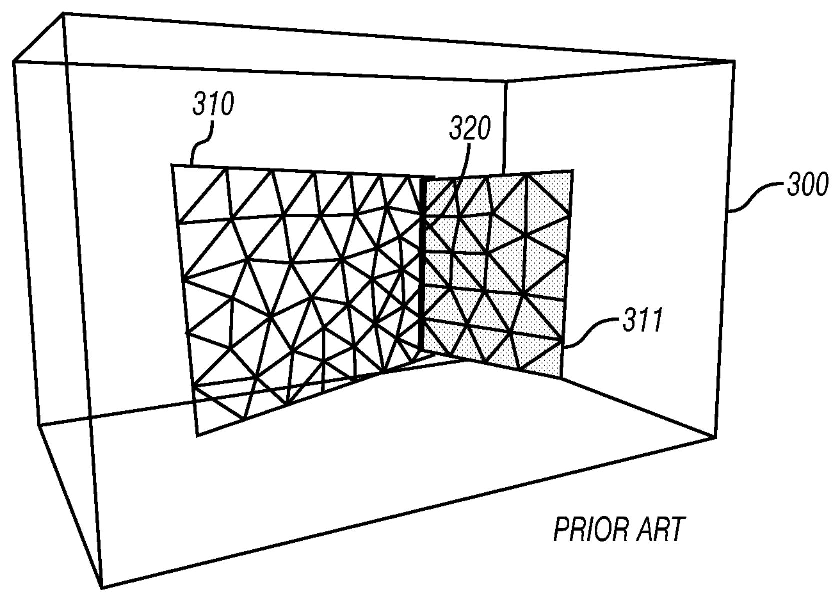
FIG. 3A-3B illustrate some aspects of computation methods.
Figure 3B:
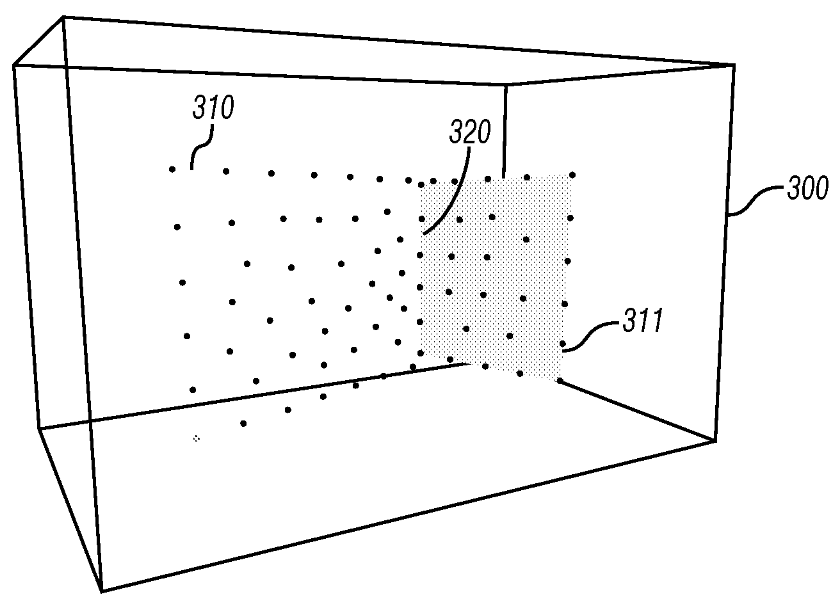

As illustrated by FIG. 3B, and in comparison with the example previously described by reference to FIG. 3A, the sampling of the points $P_i$ may be performed in different ways on the surface of the fractures 310, 311. In particular the sampling points $P_i$ need not to be aligned along the fracture intersections 320 but can be arbitrary located on the surfaces of fractures.

The computation method described herein provides as comparably accurate result as the flow-based method but with a far reduced computational time, with a ratio of about 10 to 100 depending on the complexity of the fracture network. Pressure values may be computed for the spatial locations of those sample points $P_i$ by solving a linear equation set obtained by transforming the partial differential equations of the flow model into a discretized form using approximation functions defined relatively to the sampled points $P_i$. This computation method for solving the partial differential equations (PDE) of a flow model and performing the discretization is referred to herein as the «meshless» method.

The present disclosure is made below with reference to functions, engines, block diagrams and flowchart illustrations of the methods, systems, and computer program according to one or more example embodiments. Each described function, engine, block of the block diagrams and flowchart illustrations can be implemented in hardware, software, firmware, middleware, microcode, or any suitable combination thereof. If implemented in software, the functions, engines, blocks of the block diagrams and/or flowchart illustrations can be implemented by computer program instructions or software code, which may be stored or transmitted over a computer-readable medium, or loaded onto a general purpose computer, special purpose computer or other programmable data processing apparatus to produce a machine, such that the computer program instructions or software code which execute on the computer or other programmable data processing apparatus, create the means for implementing the functions described therein.

Embodiments of computer-readable media includes, but are not limited to, both computer storage media and communication media including any medium that facilitates transfer of a computer program from one place to another. Specifically, software instructions or computer readable program code to perform embodiments described therein may be stored, temporarily or permanently, in whole or in part, on a non-transitory computer readable medium of a local or remote storage device including one or more storage media.

As used herein, a computer storage medium may be any physical media that can be read, written or more generally accessed by a computer. Examples of computer storage media include, but are not limited to, a flash drive or other flash memory devices (e.g. memory keys, memory sticks, key drive), CD-ROM or other optical storage, DVD, magnetic disk storage or other magnetic storage devices, memory chip, RAM, ROM, EEPROM, smart cards, or any other suitable medium from that can be used to carry or store program code in the form of instructions or data structures which can be read by a computer processor. Also, various forms of computer-readable medium may be used to transmit or carry instructions to a computer, including a router, gateway, server, or other transmission device, wired (coaxial cable, fiber, twisted pair, DSL cable) or wireless (infrared, radio, cellular, microwave). The instructions may comprise code from any computer-programming language, including, but not limited to, assembly, C, C++, Basic, HTML, PHP, Java, Javascript, etc.

The computing system 100 may be implemented as a single hardware device, for example in the form of a desktop personal computer (PC), a laptop, a personal digital assistant (PDA), a smart phone or may be implemented on separate interconnected hardware devices connected one to each other by a communication link, with wired and/or wireless segments.

In one or more embodiments, the computing system 100 operates under the control of an operating system and executes or otherwise relies upon various computer software applications, components, programs, objects, modules, data structures, etc.

Figure 2A:
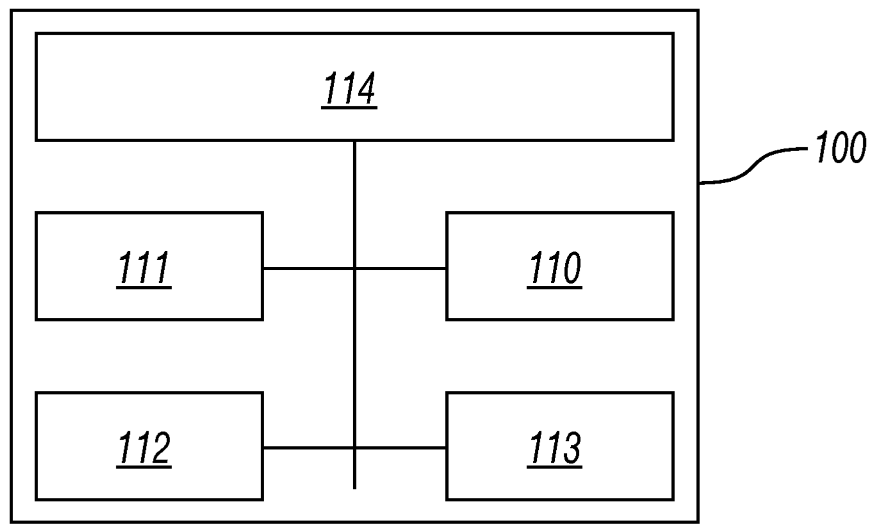
FIG. 2A-2B illustrates an example of an embodiment of a computing system.

As illustrated schematically by FIG. 2A, the computing system 100 comprises a processing unit 110, memory 111, one or more computer storage media 112, and other associated hardware such as input/output interfaces (e.g. device interfaces such as USB interfaces, etc., network interfaces such as Ethernet interfaces, etc.) and a media drive 113 for reading and writing the one or more compute storage media.

The memory 111 may be a random access memory (RAM), cache memory, non-volatile memory, backup memory (e.g., programmable or flash memories), read-only memories, or any combination thereof. The processing unit 110 may be any suitable microprocessor, integrated circuit, or central processing unit (CPU) including at least one hardware-based processor or processing core.

In one or more embodiments, the computer storage medium or media 112 comprises computer program instructions which, when executed by the computing system 100, cause the computing system 100 to perform one or more method described herein for the computing system 100. The processing unit 110 is a hardware processor that processes instructions. For example, the processing unit 110 may be an integrated circuit for processing instructions. For example, the processing unit may be one or more cores or micro-cores of a processor. The processing unit 110 of the computing system 100 may be configured to access to said one or more computer storage media 112 for storing, reading and/or loading computer program instructions or software code that, when executed by the processor, causes the processor to perform the blocks of a method described herein for the computing system 100. The processing unit 110 may be configured to use the memory 111 when executing the blocks of a method described herein for the computing system 100, for example for loading computer program instructions and for storing data generated during the execution of the computer program instructions.

In one or more embodiments, the computing system 100 receives a number of inputs and outputs for communicating information externally. For interface with a user or operator, the computing system 100 generally includes a user interface 114 incorporating one or more user input/output devices, such as a touchscreen, keyboard, mouse, microphone, touchpad, electronic pen, or any other type of input device. Otherwise, user input may be received, e.g., over a network interface coupled to a communication network, from one or more external computer devices or systems.

Figure 2B:
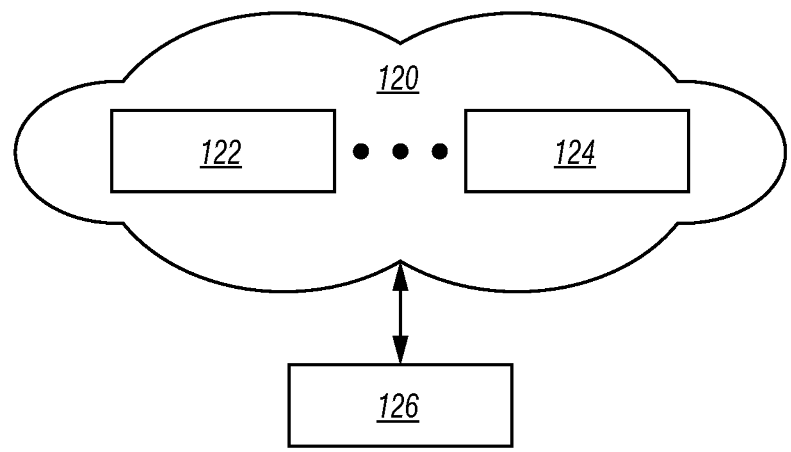

The computing system 100 in FIG. 2A may be connected to or be a part of a network. For example, as shown in FIG. 2B, the network 120 may include multiple nodes (e.g., node X 122, node Y 124). Each node may correspond to a computing system, such as the computing system shown in FIG. 2A, or a group of nodes combined may correspond to the computing system shown in FIG. 2A. By way of an example, embodiments may be implemented on a node of a distributed system that is connected to other nodes. By way of another example, embodiments may be implemented on a distributed computing system having multiple nodes, where each portion of one or more embodiments may be located on a different node within the distributed computing system. Further, one or more elements of the aforementioned computing system 100 may be located at a remote location and connected to the other elements over a network.

Although not shown in FIG. 2B, the node may correspond to a blade in a server chassis that is connected to other nodes via a backplane. By way of another example, the node may correspond to a server in a data center. By way of another example, the node may correspond to a computer processor or micro-core of a computer processor with shared memory and/or resources.

The nodes (e.g., node X 122, node Y 124) in the network 120 may be configured to provide services for a client device 126. For example, the nodes may be part of a cloud computing system. The nodes may include functionality to receive requests from the client device 126 and transmit responses to the client device 126. The client device 126 may be a computing system, such as the computing system shown in FIG. 2A. Further, the client device 126 may include and/or perform all or a portion of one or more embodiments.

The Flow-Based Model

In each simulation cell of a given simulation grid, the effective permeability—also referred to as the equivalent permeability—induced by the fractures present in a simulation cell 300 may be computed. In one or more embodiment, the effective permeability is computed in dependence upon pressure values of the pressure field in the simulation cell 300.

Figure 4:
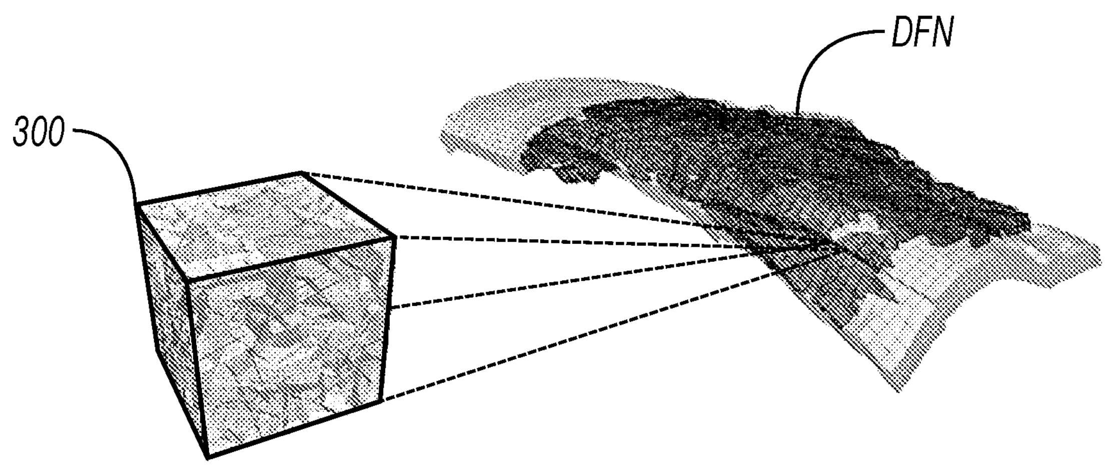
FIG. 4 illustrates some aspects of a computation method.

In one or more embodiments, the simulation grid is made of a set of parallelepipedic simulation cells. Each simulation cell 300 is for example a three-dimensional parallelepiped, e.g. a rectangular parallelepiped. As illustrated schematically by FIG. 4, attributes of a fracture network DFN are obtained for the fractures present inside a simulation cell 300.

In one or more embodiment the computation of pressure values and the effective permeability values in a simulation cell of a simulation grid relies on a flow-based model and the corresponding flow-based equations. Those flow-based equations may for example be written by applying the Laplace equations and the Darcy law. To simplify the simulation, the flow-based model is defined for a single-phase flow in steady state of an incompressible fluid with constant viscosity through a non-porous media. In at least one embodiment, the following partial derivatives equations of the flow-based model may be written as $$\operatorname{div}(K\nabla p)=0 \text{ on } \Omega \quad \text{(eq1)}$$

$$p=\bar{p} \text{ on } \Gamma\subset\partial\Omega \quad \text{(eq2)}$$

where:

div is the divergence operator,

K is the permeability tensor of the fracture network inside the simulation cell 300;

p is the pressure field to be determined, $\nabla p$ is the pressure gradient, $\bar{p}$ is a prescribed pressure applied on the boundary of the simulation cell 300, which may take different arbitrary values, $\Omega$ represents a spatial domain corresponding to the fractures present inside the simulation cell 300, $\Gamma$ represents the intersection of $\Omega$ with the simulation cell boundaries, i.e. $\Gamma$ represents the intersection of the fractures present inside the simulation cell 300 with the simulation cell boundaries; it is assumed that the Dirichlet conditions apply to $\Gamma$.

The equation (eq1) expresses the mass and volume conservation principle applied to the incompressible fluid. The equation (eq1) forms the partial derivatives equations (PDE) of flow-based model.

The permeability tensor K is represented by a 3×3 symmetric matrix, whose matrix coefficient $k_{ij}$ represents the directional effect of the set of fractures present in the simulation cell 300 on fluid flow in the three directions of the space relatively to the simulation coordinate system (x, y, z) in which the simulation cell 300 is defined. The permeability tensor K may thus be written:

$$K=\begin{bmatrix} k_{xx} & k_{xy} & k_{xz} \\ k_{yx} & k_{yy} & k_{yz} \\ k_{zx} & k_{zy} & k_{zz} \end{bmatrix} \quad \text{(eq 3)}$$

The above equations (eq1) and (eq2) are applicable to the three spatial directions d=I, II, III for determining the pressure values along these three directions d=I, II, III, these three directions corresponding respectively to the x, y, z axis of the simulation cell 300.

In order to solve numerically the PDE equation (eq1), the so-called "strong form" of the flow-based equations represented by equation (eq1) may be transformed into the so-called "weak-form". The "weak-form" relies on an approximation of the solution to equation (eq1) by means of a test function, noted w(x), and is obtained by multiplying the strong-form by the so-called "test function" w(x) and by integrating by parts the "strong form" on the spatial domain $\Omega$, defined by the fractures within the simulation cell. As will be explained below, the test function w(x) may be arbitrary chosen since the computed pressure values $p_i$ are not dependent on the values of the test function.

The "weak-form" of the PDE equations of the flow-based model may be written in the following way:

$$\int_{\partial\Omega\backslash\Gamma} K\nabla p\cdot n\cdot w\,dS-\int_{\Omega} K\nabla p\cdot\nabla w\,d\Omega\alpha\int_{\Gamma}(p-\bar{p})w\,dS=0 \quad \text{(eq4)}$$

where the constant $\alpha$ is used to impose the conditions on the boundaries of the simulation cell 300; $\alpha$ may be arbitrary chosen such that $\alpha>>1$ and is used to control the condition on the boundaries of the spatial domain $\Omega$;

n is unit vector normal at $\partial\Omega\backslash\Gamma$;

dS is a surface element on a fracture.

The «Meshless» Method

The PDE equation (eq4) may be solved in different ways in order to compute the pressure values. In one or more embodiments, the «meshless» method, that will be described with more details below, relies on computation methods such as the so-called background mesh like the Element Free Galerkin (hereafter EFG method) (disclosed for example by Belytschko et al. 1994) or the purely meshless method like the Meshless Local Petrov Galerkin (hereafter MLPG method) (disclosed for example by Atluri and Zhu, 1999). In one or more embodiments, the «meshless» method allows to transform the "weak form" of equation (eq4) into a discrete form, and thus performs a discretization of PDE equations of the flow-based model. This discrete form of the flow-based equations corresponds a linear equation system from which discrete pressure values of the pressure field may be computed.

Spatial Sampling

In order to generate the discrete form of the flow-based model, a set of sampled points $P_i$—also referred to therein as "simulation points" or "nodes"—are spatially sampled on the surfaces of the fractures of the fracture network. In at least one embodiment, each fracture is represented by a planar shape and a thickness, and the surface of the fracture thus corresponds to the surface of the planar shape representing this fracture. The fracture surface may for example be represented by a planar parallelepiped (e.g. a rectangle) and the points Pi are sampled on this surface. In at least one embodiment, in order to take into account the fracture thickness, the surface representing the fracture may be a planar shape in a medium plane relatively to the fracture thickness.

Figure 5A:
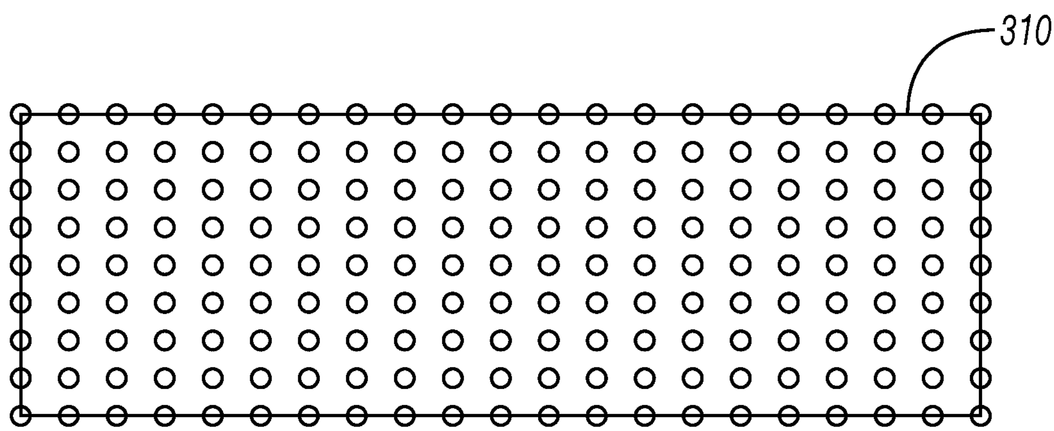
FIG. 5A-5B illustrates some aspects of a computation method.
Figure 5B:
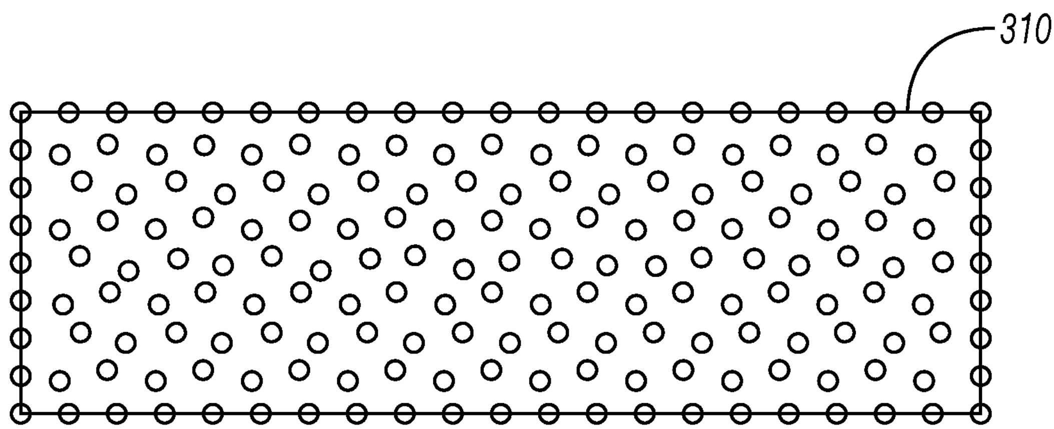

FIGS. 5A and 5B illustrate several embodiments for sampling points on a fracture surface. Both figures represent a fracture 310 by a rectangle. The sampled points $P_i$ can be either a regular set of points (as illustrated by FIG. 5A), i.e. generated using with a fixed spatial sampling period in one or two directions in the fracture surface, or a set of irregular nodes (as illustrated by FIG. 5B), e.g. with randomly determined locations on the fracture surface. For example, as illustrated by FIG. 5A representing a rectangular fracture, the sampled points $P_i$ may be aligned vertically and horizontally on a rectangular sampling grid.

The intersection lines between the fractures do not need to be sampled and the removal of any node that falls outside the simulation cell 300 can be performed very simply and quickly.

In one or more embodiments, for each sampled point $P_i$, the values of the attributes of the fracture from which a sampled point $P_i$ has been sampled will be assigned to that sampled point $P_i$ and used in the resolution of the partial derivative equations. In particular, the value $K_i$ or the permeability induced by the fracture and/or directly the value e of the thickness of the fracture will be assigned to the sampled point $P_i$.

Interpolation Scheme—Shape Functions

In one or more embodiments, the «meshless» method further relies on an approximation scheme for approximating a function (e.g. the pressure field p) by means of shape functions and discrete values (e.g. pressures values $p_i$) associated with the sampled points $P_i$. Different approximation scheme may be used, for example the Moving Least Squares (MLS), the Partition of Unity (PU) or the Shepard functions. In the below description, the Moving Least Squares (MLS) will be used to illustrate an example embodiment.

In the MLS approximation scheme, a shape function is defined relatively to a reference point P having a given spatial location, the shape function having for example a symmetry property relatively to this reference point P. In one or more embodiments, for each sample point $P_i$, a corresponding shape function is defined by assigning to the reference point P the spatial location of the sample point $P_i$ in the volume area of the simulation cell. A shape function is thus associated with each node (sampled point $P_i$). For example, assuming a fracture is represented by a planar shape, a two-dimensional shape function $\Phi_i^{MLS}(x, y)$ may be defined in the plane of the fracture for the sampled points $P_i$ inside that planar shape. The set of these functions constitutes a basis of the functional space in which the discrete approximation of the solution of the PDE is performed.

In practical applications, the shape function is non-zero over the small neighborhood of the associated node (sampled point $P_i$) and this neighborhood is called the domain of influence of the node. Outside this domain of influence the value of the shape function is zero or is vanishing.

Different shape functions may be used with circular, elliptic, rectangular or any other convenient regular closed domain of influence. The domain of influence may be a two-dimensional domain of influence or three-dimensional domain of influence. In the three-dimensional case, the domain of influence can be a sphere, an ellipsoid, a cube or any other simple volume area. In at least one embodiment, when a fracture is represented by a planar shape (e.g. by a rectangle or a planar parallelepiped), a two-dimensional domain of influence is chosen for the shape functions. In at least one embodiment, when the DFN is made up of rectangular fractures, a regular sampling of points on the fracture surfaces is performed and a rectangular domain of influence is chosen for the shape functions.

Figure 6A:
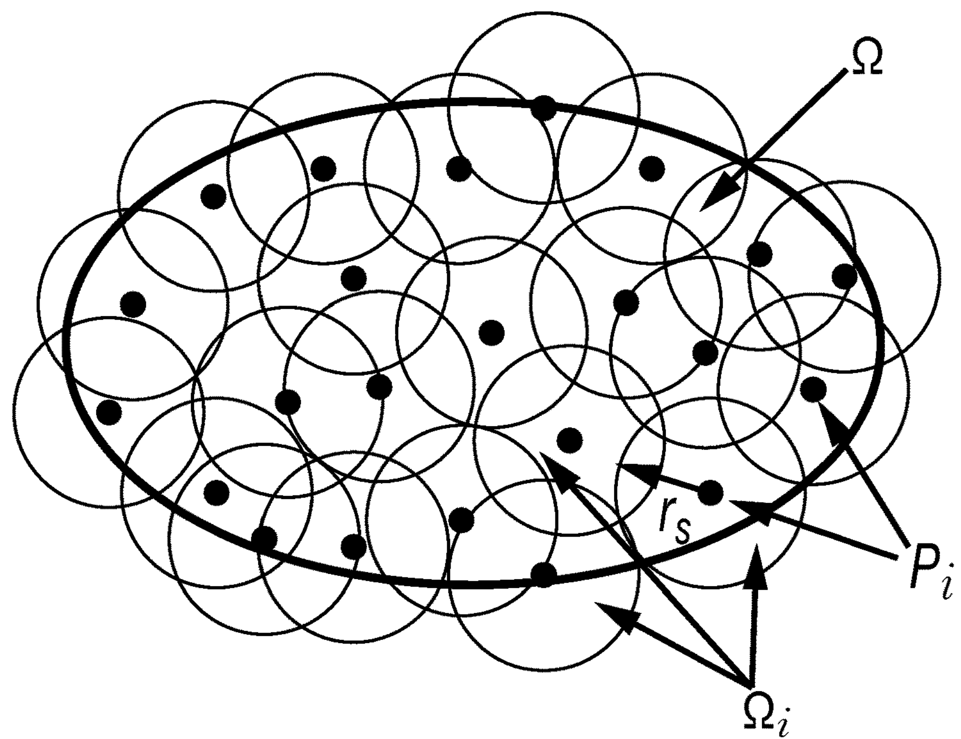
FIG. 6A-6D illustrates some aspects of a computation method.
Figure 6B:
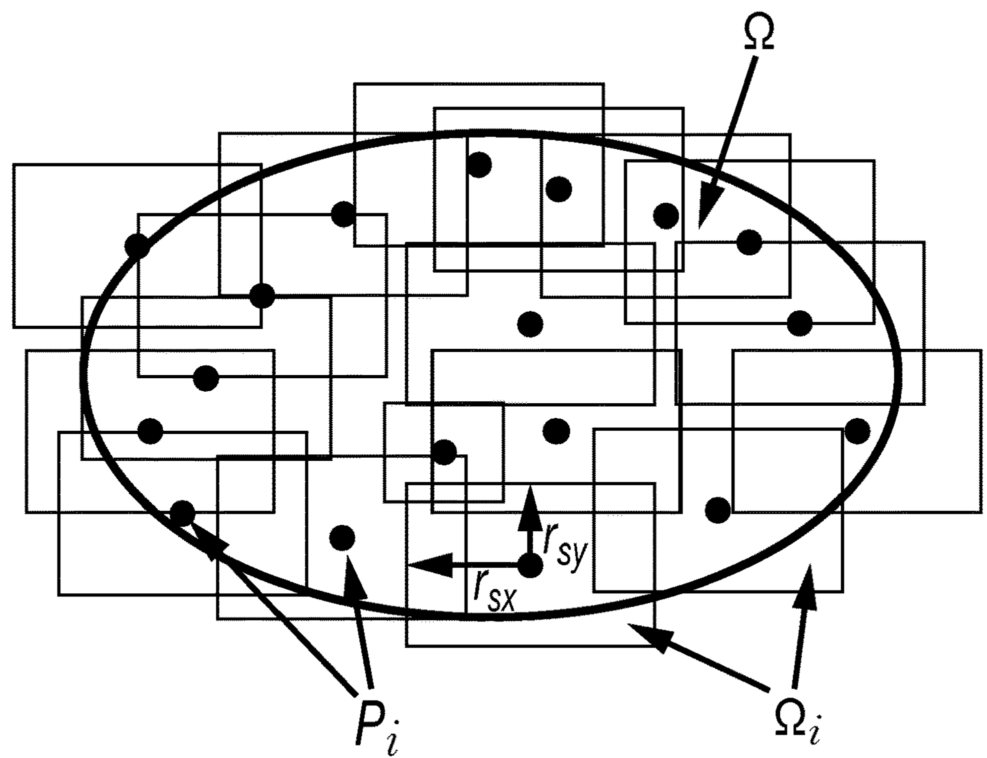

In the example illustrated by FIG. 6A, circular domains of influence $\Omega_i$ are defined around each sampled points $P_i$ in the spatial domain $\Omega$. In the example illustrated by FIG. 6B, rectangular domains of influence $\Omega_i$ are defined around each sampled points $P_i$ in the spatial domain $\Omega$.

Figure 6C:
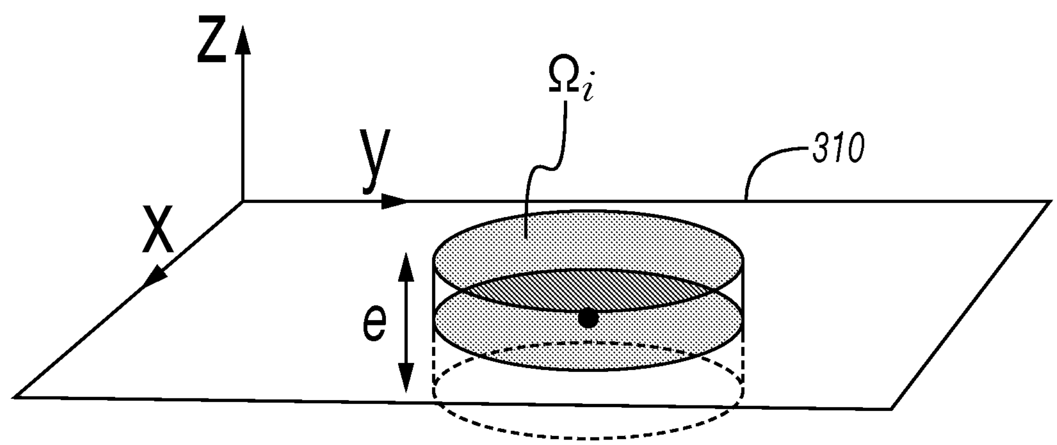

In one or more embodiments, the thickness of the fracture is taken into account in the shape function defined for a sample point $P_i$. Indeed, since the intersection lines between two fractures are not explicitly represented by the sample points, and in order to improve the relevance of the simulation, the thickness of the fracture is taken into account in the shape function in the normal direction to the fracture. The thickness parameter of the shape function can be taken proportional or equal to the thickness assigned to the fracture in the DFN. For example, the shape function may be mathematically defined like this:

$$\Phi_i^{MLS}(x,y,z)=\Phi_i^{MLS}(x,y)*1_{[-e/2,e/2]}(z) \quad \text{(eq5a)}$$

where $$1_{[-e/2,e/2]}(z)=1 \text{ if } \in[-e/2,e/2] \text{ and}$$

$$1_{[-e/2,e/2]}(z)=0 \text{ otherwise} \quad \text{(eq5b)}$$

and where $\Phi_i^{MLS}(x, y)$ is two-dimensional shape function defined in the plane of the fracture around the point $P_i$ and e is the thickness of the fracture. FIG. 6C illustrates one embodiment of a three-dimensional domain of influence $\Omega_i$ of a three-dimensional shape function corresponding to equation (eq5a).

In one or more embodiment, the MLS approximation scheme is used and each shape function is accordingly defined in dependence upon of a weight function $w^{MLS}$:

$$\Phi_i^{MLS}(x,y)=p^{MLS^T}(x,y)M^{MLS}(x,y)^{-1}w^{MLS}(x-x_i, y-y_i)p^{MLS}(x_i,y_i) \quad \text{(eq5c)}$$

The two-dimensional weight function $w^{MLS}$ may for example be defined on the basis of a spline function or a Gaussian function. In at least one embodiment, given a sampled point $P_i$ of coordinates $(x_i, y_i)$ in the plane of the fracture, the weight function may be defined like this:

$$w_i^{MLS}(x, y) = \begin{cases} 1 \quad 6D_i^2 + 8D_i^3 \quad 3D_i^4, & 0 \le D_i \le 1 \\ 0, & D_i > 1 \end{cases} \quad \text{(eq 5d)}$$

where $D_i=\sqrt{(x-x_i)^2+(y-y_i)^2}/r$ and r is the radius of a circular domain of influence around the reference point $P_i$.

Further example shape functions and weight functions are disclosed in the document entitled "An Introduction to mesh-free methods and their programming", by Liu G R et al, Springer, 2005.

Discretization of the PDE

The shape functions are used for approximating the pressure field p(x, y, z) and the test function w(x, y, z) at location (x, y, z) in the simulation cell 300. In one or more embodiment, a first set of shape functions may be used for the approximation of the pressure, and a second set of shape functions, distinct from the first set, may be used for the approximation of the test function w(x). By way of another example, the same set of shape functions is used for both approximations.

In at least one embodiment, the MLS approximation scheme is used and the approximation may be defined like this:

$$p(x,y,z)=\Sigma_{i=1,N}\Phi_i^{MLS}(x,y,z)p_i \quad \text{(eq6a)}$$

and $$w(x,y,z)=\Sigma_{i=1,N}\Phi_i^{MLS}(x,y,z)w_i \quad \text{(eq6b)}$$

where N is the total number of sample points, $w_i$ is a value defined for the test function at the sampled point $P_i$, and $p_i$ is the pressure value to be determined for the sampled point $P_i$.

By injecting the approximation of equations (eqa) and (eqb) into the PDE of equation (eq), the following discrete form of the flow based equations is derived:

$$\int_{\partial\Omega\setminus\Gamma}K\nabla p\cdot n\cdot wdS=\Sigma_{ij}\int_{\partial\Omega\setminus\Gamma}K\nabla\Phi_i^{MLS}n\cdot\Phi_j^{MLS}p_i\cdot w_jdS \quad \text{(eq7a)}$$

$$\int_{\Omega}K\nabla p\cdot\nabla wd\Omega=\Sigma_{ij}\int_{\Omega}K\nabla\Phi_i^{MLS}\cdot\nabla\Phi_j^{MLS}\cdot p_i\cdot w_jd\Omega \quad \text{(eq7b)}$$

$$\int_{\Gamma}(p-\bar{p})wdS=\Sigma_{i,j}\int_{\Gamma}(\Phi_i^{MLS}p_i-\bar{p})\Phi_j^{MLS}w_jdS \quad \text{(eq7c)}$$

where the indexes i,j run from 1 to N.

The above equations (eq10a), (eq10b), (eq10c) can be also written as:

$$\text{For all } W\in R^N,\ W^TAP=W^TB \quad \text{(eq7d)}$$

where $$W = \begin{bmatrix} w_1 \\ \dots \\ w_N \end{bmatrix}, P = \begin{bmatrix} p_1 \\ \dots \\ p_N \end{bmatrix},$$

A is N*N matrix of coefficients $A_{ij}$ and B a N*1 vector of coefficients $B_i$ $$B_i: B = \begin{bmatrix} B_1 \\ \dots \\ B_N \end{bmatrix}.$$

Finally the linear equation system to be solved to compute the pressure values $p_i$ is independent of the vector W and can be written as:

$$AP=B \quad \text{(eq8a)}$$

where:

$$A_{ij}=\int_{\partial\Omega\setminus\Gamma} K\nabla\Phi_i^{MLS} n\cdot\Phi_j^{MLS} dS+\alpha\int_\Gamma \Phi_i^{MLS}\Phi_j dS+\int_\Omega K\nabla\Phi_i^{MLS}\cdot\nabla\Phi_j^{MLS} d\Omega \quad \text{(eq8b)}$$

$$B_i=\alpha\bar{p}\int_\Gamma \Phi_i^{MLS} dS \quad \text{(eq8c)}$$

Assuming that the spatial domain Ω is made up of a single fracture, the permeability of that fracture may be evaluated by the following cubic law:

$$K = \frac{e^3}{12} u \quad u^T \quad \text{(eq 11d)}$$

where e is the thickness of the fracture and u the unit vector collinear to the main direction of the fracture. As illustrated by FIG. 6*c*, the main direction of a rectangular fracture 310 is for example the direction in which the fracture is the biggest, e.g. the direction y of the length of the fracture when the length is higher than the width.

In one or more embodiment, the computation of the integrals of equations (eq8b) and (eq8c) is based on the MLPG method. The MLPG method is a purely meshless method, which does not use any background mesh for the computation of the integrals.

Figure 7A:
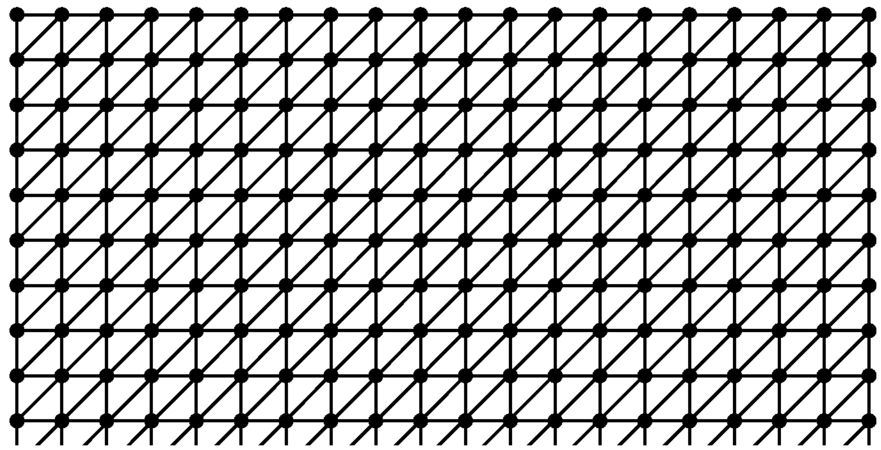
FIG. 7A-7B illustrates some aspects of a computation method.
Figure 7B:
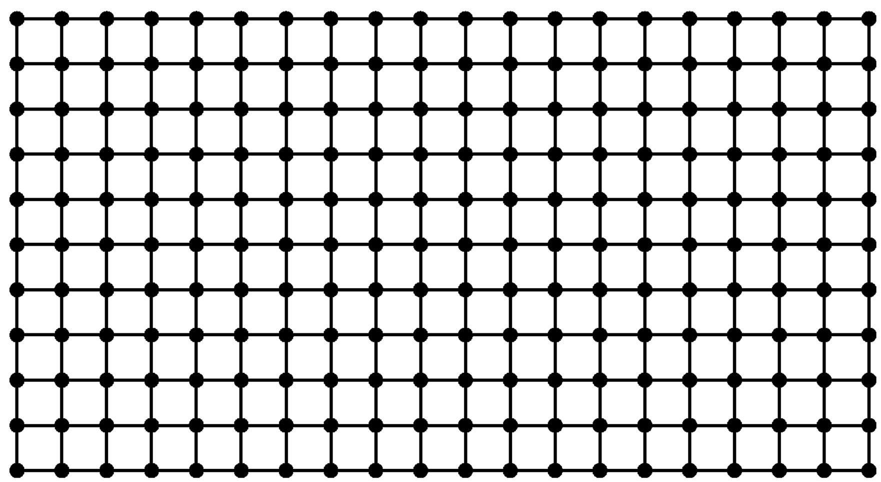

In other embodiments, the computation of the integrals of equations (eq8b) and (eq8c) is performed by using a background mesh inside the simulation cell 300. For such a background mesh the constraints discuss above in the background section for a mesh representing the fractures and their intersections does not exist. Therefore, the background mesh may be arbitrary chosen. Example background meshes that may be used for the integral computation are represented schematically by FIGS. 7A and 7B. A triangular background mesh (FIG. 7A) or a rectangular/quadrangular background (FIG. 7B) mesh may be used.

Using a background mesh, each integral of equations (eq11b) and (eq11c) may be written as a sum over each background cell Elt of the background mesh. For example, since each integrand is constant along z direction (x, y remaining fixed), each integral on a volume area of a function ƒ(x, y, z) can be computed as a sum of integrals computed over a background cell Elt $$\int_\Omega f(x,y,z)d\Omega=\Sigma_{Elt} e\cdot\int_{Elt} f(x,y,0)d\Omega \quad \text{(eq9)}$$

The equations (eq8a), (eq8b), (eq8c) and this equation (eq9) are applicable to a single fracture as well as to the whole spatial domain Ω representing a set of fractures in the simulation cell 300. Thus the integral computation may be performed fracture by fracture before summing up the results obtained for each individual fracture. The coefficients $A_{ij}$ and $B_j$ are thus computed for a single fracture, then the matrix A and B are computed by summing the results obtained for each individual fracture before computing the pressure values $p_i$ by inverting the matrix A.

The numerical integral computation may be based for example on the common quadrature formula (Gauss integration) and may use the so-called Gauss points (see for example the document entitled "The Finite Element Method", by Zienkiewicz, Taylor & J. Z. Zhu, Elsevier, 2005). For example, a quadrangular background mesh is used with 1, 2*2 or 3*3 Gauss points per quadrangular cell of the background mesh. The general form of the quadrature formula for integrating a ƒ(x) with $N_g$ Gauss points $x_{G_i}$ may thus be computed for a background cell by:

$$\int_{Elt} f(x)dx=\Sigma_{i=1}^{N_g} w_i^G f(x_{G_i})\det F(x_{G_i}) \quad \text{(eq10)}$$

where $w_i^G$ represent a weighting coefficient specified by the Gaussian integration method.

Figure 6D:
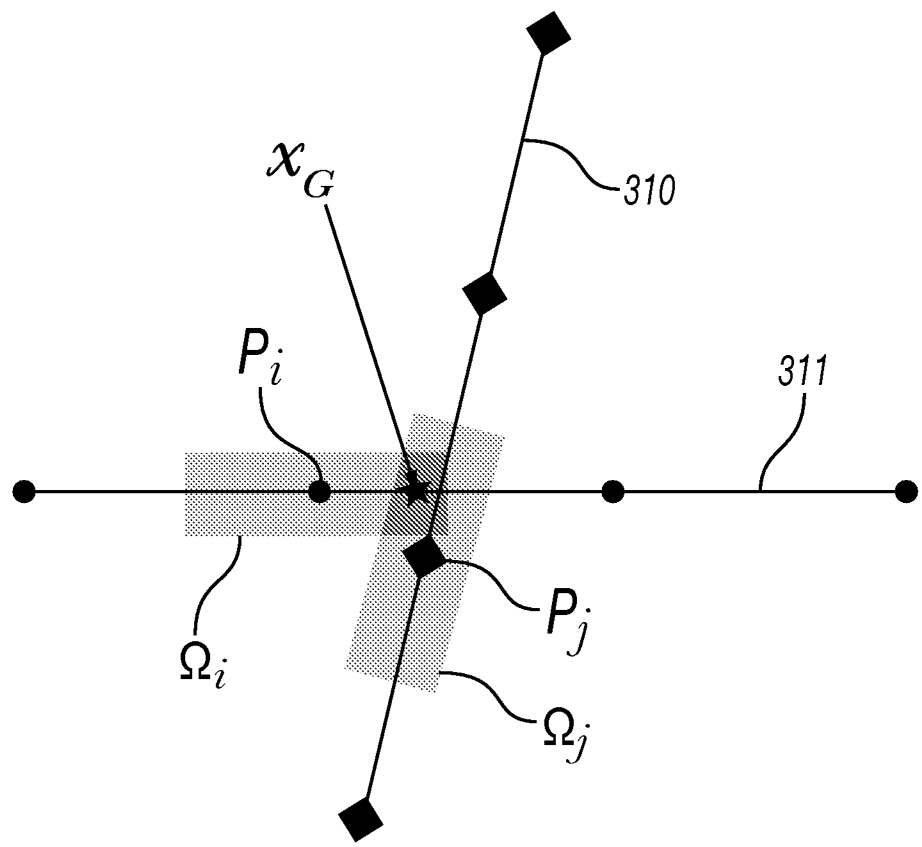

A Gauss point $x_{G_i}$ could belong to the domain of influence of several shape functions or fall outside the current simulation cell 300. If a Gauss point falls outside the current simulation cell 300, the Gauss point is ignored. As illustrated by FIG. 6D, when the thickness e assigned to a fracture is taken into account in the shape function of a sampled point (see for example above equation (eq5a)), a Gauss point might belong to the domain of influence of two shape functions $\Phi_i^{MLS}$ and $\Phi_j^{MLS}$ Indeed taking into account the fracture thickness in the shape function allows to simulate the propagation of the pressure from a facture to another via the cross terms $\Phi_i^{MLS}\cdot\Phi_j^{MLS}$ or their gradients $\nabla\Phi_i^{MLS}\cdot\nabla\Phi_j^{MLS}$ present in equation (eq8b). As a consequence, the intersection of the fractures does not need to be sampled which results in a simplified simulation process and a reduced computation time.

Effective Permeability

After computation of the pressure field p by means of a set of discrete pressure values $p_i$, the effective permeability may be computed for a simulation cell 300. The computation may be performed according to the method disclosed in the document entitled "Permeability tensor of three-dimensional fractured porous rock and a comparison to trace map predictions" by P. S. Lang et al., Journal of Geophysical Research, 2014.

Using this computation method, the Darcy's law is used to relate the filtration velocity u and the pressure gradient:

$$u = \frac{K}{\mu}\nabla p \quad \text{(eq 14a)}$$

or $$u_j = \frac{k_{ij}}{\mu}\frac{\partial p}{\partial x_i} \quad \text{(eq 14b)}$$

where:

K is the effective permeability tensor (3*3 matrix) and the coefficients of the effective permeability tensor K (to be determined), μ is the fluid viscosity (constant, may be chosen equal to 1), ∇p the computed pressure gradient, $u_j$ the filtration velocity along the j=x, y or z axis, $$\frac{\partial p}{\partial x_i}$$

is the pressure gradient along xi in the local coordinates system of the fracture, i,j representing x, y, z in the local coordinates system of the fracture.

In at least one embodiment, in each direction d (where d=I, II or III) the meshless version of the volume-averaged values over a simulation cell 300 for an oriented flux $<u_i>$ and the gradient pressure $$\left\langle\frac{\partial p}{\partial x_i}\right\rangle$$

is computed by:

$$\langle u_i\rangle = \frac{1}{V_{cell}}\Sigma_{Elt}\int_{Elt} u_i^{Elt}\,dV \quad \text{(eq 12a)}$$

$$\left\langle\frac{\partial p}{\partial x_i}\right\rangle = \frac{1}{V_{cell}}\Sigma_{Elt}\int_{Elt}\frac{\partial p^{Elt}}{\partial x_i}dV \quad \text{(eq 12b)}$$

where $<u_i>$ is the average filtration velocity along the i=x, y or z axis, $$\left\langle\frac{\partial p}{\partial x_i}\right\rangle$$

is the average pressure gradient along i

Elt is an element of a background mesh defined in the simulation cell 300, $V_{cell}$ is the volume of the simulation cell 300.

In at least one embodiment, a quadrature formula may be used for computing the integral (see for example the document entitled "The Finite Element Method", by R. L. Taylor et al., Elsevier, 2005).

The equivalent permeability tensor $k_{ij}$ is hence given by discretization of the equation (eq12b):

$$\begin{bmatrix} \langle\partial P_0\rangle^I & \langle\partial P_1\rangle^I & \langle\partial P_2\rangle^I \\ \langle\partial P_0\rangle^{II} & \langle\partial P_1\rangle^{II} & \langle\partial P_2\rangle^{II} \\ \langle\partial P_0\rangle^{III} & \langle\partial P_1\rangle^{III} & \langle\partial P_2\rangle^{III} \\ I_0 & I_1 & I_2 \end{bmatrix}\begin{bmatrix} k_{xx} \\ k_{xy} \\ k_{xz} \\ k_{yx} \\ k_{yy} \\ k_{yz} \\ k_{zx} \\ k_{zy} \\ k_{zz} \end{bmatrix} = \begin{bmatrix} \langle u_x\rangle^I \\ \langle u_y\rangle^I \\ \langle u_z\rangle^I \\ \langle u_x\rangle^{II} \\ \langle u_y\rangle^{II} \\ \langle u_z\rangle^{II} \\ \langle u_x\rangle^{III} \\ \langle u_y\rangle^{III} \\ \langle u_z\rangle^{III} \\ 0 \\ 0 \\ 0 \end{bmatrix} \quad \text{(eq 12c)}$$

-continued

Where: (12d)

$$\langle\partial P_0\rangle^i = \begin{bmatrix} \left\langle\frac{\partial p}{\partial x}\right\rangle^i & \left\langle\frac{\partial p}{\partial y}\right\rangle^i & \left\langle\frac{\partial p}{\partial z}\right\rangle^i \\ 0 & 0 & 0 \\ 0 & 0 & 0 \end{bmatrix} \quad I_0 = \begin{bmatrix} 0 & 1 & 0 \\ 0 & 0 & 1 \\ 0 & 0 & 0 \end{bmatrix}$$

$$\langle\partial P_1\rangle^i = \begin{bmatrix} 0 & 0 & 0 \\ \left\langle\frac{\partial p}{\partial x}\right\rangle^i & \left\langle\frac{\partial p}{\partial y}\right\rangle^i & \left\langle\frac{\partial p}{\partial z}\right\rangle^i \\ 0 & 0 & 0 \end{bmatrix} \quad I_1 = \begin{bmatrix} -1 & 0 & 0 \\ 0 & 0 & 0 \\ 0 & 0 & 1 \end{bmatrix}$$

$$\langle\partial P_2\rangle^i = \begin{bmatrix} 0 & 0 & 0 \\ 0 & 0 & 0 \\ \left\langle\frac{\partial p}{\partial x}\right\rangle^i & \left\langle\frac{\partial p}{\partial y}\right\rangle^i & \left\langle\frac{\partial p}{\partial z}\right\rangle^i \end{bmatrix} \quad I_2 = \begin{bmatrix} 0 & 0 & 0 \\ -1 & 0 & 0 \\ 0 & -1 & 0 \end{bmatrix}$$

Effective Permeability Computation Method

Figure 8:
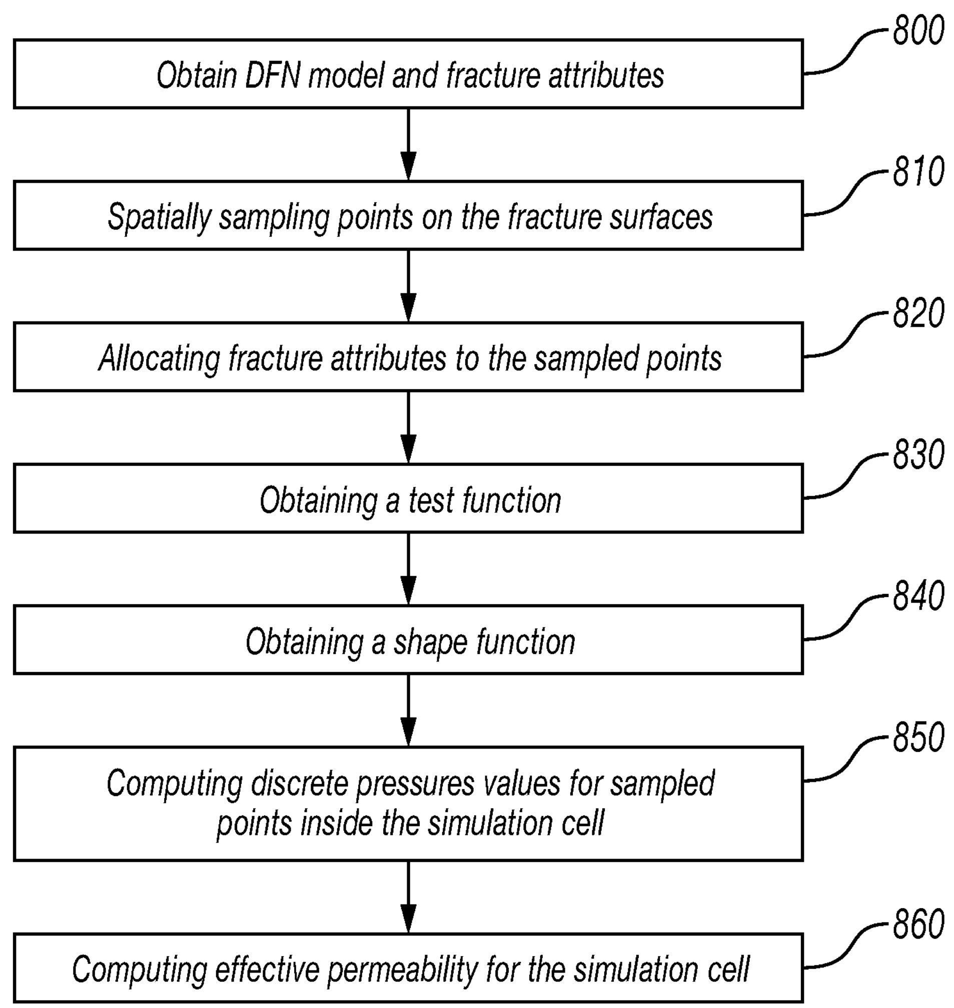
FIG. 8 illustrates an example of a flowchart of a computation method.

FIG. 8 show a flowchart in accordance with one or more embodiments of a computation method. While the various blocks in the flowchart are presented and described sequentially, one of ordinary skill will appreciate that at least some of the blocks may be executed in different orders, may be combined or omitted, and at least some of the blocks may be executed in parallel. In at least one embodiment, the computation method is performed by the computing system 100. In at least one embodiment, the computation method is performed for each simulation cell 300 of a simulation grid. The simulation cell 300 defines a volume area in the subterranean formation. The simulation cell 300 is for example a three-dimensional rectangular parallelepiped.

At block 800, a DFN model is obtained. The DFN model comprises attributes of the fractures. In at least one embodiment, each fracture is represented in the DFN model by a planar shape (e.g. a parallelepiped or a rectangle) and a thickness.

At block 810, for each fracture in a simulation cell 300, points $P_i$ are sampled on the surface of the fracture. In at least one embodiment, the points $P_i$ are sampled on the surface of the planar shape representing the fracture. In at least one embodiment, the points are randomly spatially sampled on a surface of at least one fracture. In at least one embodiment, the points are sampled at regular intervals in at least one direction on the surface of at least one fracture.

At block 820, at least one fracture attribute is assigned to each sample points $P_i$. In at least one embodiment, a thickness of the corresponding fracture is assigned to each point or a permeability induced by the corresponding fracture.

At block 830, a test function is obtained. The test function may be selected by an operator of the computing system 100 or may be selected by a computer program running on the computing system 100. The test function may be selected among a set of predefined test functions and/or parameters of the test function may be defined by an operator or by a computer program.

At block 840, a shape function is obtained. The shape function may be selected by an operator of the computing system 100 or may be selected by a computer program running on the computing system 100. The shape function may be selected among a set of predefined shape functions and/or parameters of the shape function may be defined by an operator or by a computer program. The shape function is defined relatively to a reference point P having a given spatial location. For each sample point $P_i$, a corresponding shape function is defined by assigning to the reference point P the spatial location of the sample point $P_i$ in the volume area of the simulation cell 300.

In at least one embodiment, a three-dimensional shape function is selected. In at least one embodiment, the three-dimensional shape function is a combination of a two-dimensional shape function defined in a plane including the planar shape representing the considered fracture or in a plane parallel to the planar shape representing the fracture and of a one-dimensional shape function representing a thickness of the fracture in a direction normal to the surface of the fracture at the considered sampled point.

At block 850, discrete pressure values $p_i$ for the locations corresponding to the sampled points $P_i$ are computed by solving for the sampled points $P_i$ partial derivative equations of a flow model using the at least one allocated attribute. In at least one embodiment, the discrete pressure values are computed as a solution of a set of discrete linear equations obtained from the partial derivative equations by means of a discrete approximation of the pressure field at the sampled points. In at least one embodiment, the discrete equation systems represents a discrete form of a flow model for the sampled points $P_i$. In at least one embodiment, the pressure values $p_i$ are computed on the basis of the linear equation system of equations (eq8a), (eq8b), (eq8c).

In one or more embodiment, the discrete approximation relies on a moving least square approximation. In at least one embodiment, the discrete approximation relies on set of three-dimensional shape functions defined for the sampled points, each said three-dimensional shape function defining a domain of influence of a sampled point at block 840.

At block 860, the effective permeability is computed for the current simulation cell 300 on the basis of the pressure values obtained at block 850. In at least one embodiment, the effective permeability is computed on the basis of the equations (eq12a) and (eq12b).

In one or more embodiment, a fluid reservoir simulation is performed on the basis of the effective permeability values computed at block 860.

Although the preceding description has been described herein with reference to particular means, materials, and embodiments, it is not intended to be limited to the particular disclosed herein. By way of further example, embodiments may be utilized in conjunction with a handheld system (i.e., a phone, wrist or forearm mounted computer, tablet, or other handheld device), portable system (i.e., a laptop or portable computing system), a fixed computing system (i.e., a desktop, server, cluster, or high performance computing system), or across a network (i.e., a cloud-based system). As such, embodiments extend to all functionally equivalent structures, methods, uses, program products, and compositions as are within the scope of the appended claims.

Although a few example embodiments have been described in detail above, those skilled in the art will readily appreciate that many modifications are possible in the example embodiments. Accordingly, any modifications are intended to be included within the scope of this disclosure as defined in the following claims.

The invention claimed is:

1. A method for computing effective permeability for a discrete fracture network in a subterranean environment comprising:

generating a discrete fracture network model by acquiring data in a subterranean formation using one or more data acquisition tools;

identifying fractures in the discrete fracture network model;

obtaining attributes of the fractures in the discrete fracture network using the discrete fracture network model;

spatially sampling points on the surface of fractures inside a volume of a computation cell;

allocating to each sampled point at least one attribute of the corresponding fracture;

assigning to each sample point one or more shape functions for approximating a discrete value at each sampling point;

computing discrete pressure values for the locations corresponding to the sampled points by solving partial derivative equations of a flow model using the allocated attributes and the one or more shape functions assigned to each sampling point; and computing effective permeability values induced by the fractures present in the volume of the computation cell from the discrete pressure values.

2. The method of claim 1 wherein the points are randomly spatially sampled on a surface of at least one fracture.

3. The method of claim 1 wherein the points are sampled at regular intervals in at least one direction on the surface of at least one fracture.

4. The method of claim 1 wherein said at least one attribute of the corresponding fracture comprises a thickness of the corresponding fracture.

5. The method of claim 1 or 4 wherein said at least one attribute of the corresponding fracture comprises a permeability induced by the corresponding fracture.

6. The method of claim 1 wherein said discrete pressure values are computed as a solution of a set of discrete linear equations obtained from the partial derivative equations by means of a discrete approximation of a pressure field at the sampled points.

7. The method of claim 6 wherein said discrete approximation relies on a moving least square approximation.

8. The method of claim 6 wherein said discrete approximation relies on the one or more shape functions, the one or more shape function comprising a set of three-dimensional shape functions defined for the sampled points, each of said three-dimensional shape function defining a domain of influence of a sampled point.

9. The method of claim 8 wherein for each sampled point on a given fracture, said three-dimensional shape function is a combination of a two-dimensional shape function defined in a plane including the surface of said given fracture and of a one-dimensional shape function representing a thickness of said given fracture in a direction normal to the surface of said given fracture at the considered sampled point.

10. The method of claim 1 further comprising performing a fluid reservoir simulation on the basis of the effective permeability values.

11. A computing system comprising:

one or more processors for processing data;

memory operatively coupled to the one or more processors that comprises program instructions for causing said one or more processors to perform a method for computing effective permeability according to the method of claim 1.

* * * * *